(12) United States Patent
Clevenger et al.

(10) Patent No.: US 10,361,153 B2
(45) Date of Patent: Jul. 23, 2019

(54) SURFACE NITRIDATION IN METAL INTERCONNECTS

(71) Applicant: INTERNATIONAL BUSINESS MACHINES CORPORATION, Armonk, NY (US)

(72) Inventors: Lawrence A. Clevenger, LaGrangeville, NY (US); Roger A. Quon, Rhinebeck, NY (US); Terry A. Spooner, Clifton Park, NY (US); Wei Wang, Yorktown Heights, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/797,539

(22) Filed: Oct. 30, 2017

(65) Prior Publication Data

US 2018/0082946 A1 Mar. 22, 2018

Related U.S. Application Data

(60) Continuation of application No. 15/444,933, filed on Feb. 28, 2017, now Pat. No. 10,068,846, which is a
(Continued)

(51) Int. Cl.
*H01L 21/311* (2006.01)
*H01L 21/768* (2006.01)
(Continued)

(52) U.S. Cl.
CPC .... *H01L 23/5226* (2013.01); *H01L 21/31116* (2013.01); *H01L 21/76805* (2013.01);
(Continued)

(58) Field of Classification Search
CPC .................. H01L 23/5283; H01L 21/76805
See application file for complete search history.

(56) References Cited

U.S. PATENT DOCUMENTS 5,891,513 A 4/1999 Dubin et al.
6,491,978 B1 12/2002 Kalyanam
(Continued)

OTHER PUBLICATIONS

Deepika Priyadarshini et al., Advanced Metal and Dielectric Barrier Cap Films for Cu Low k Interconnects, Interconnect Technology Conference / Advanced Metallization Conference (IITC/AMC), May 2014.
(Continued)

*Primary Examiner* — Farun Lu
(74) *Attorney, Agent, or Firm* — Tutunjian & Bitetto, P.C.; Vazken Alexanian

(57) ABSTRACT

Methods of forming vias include nitridizing exposed surfaces of a first layer and an exposed surface of a conductor underlying the first layer to form a layer of nitridation at said exposed surfaces. Material from the layer of nitridation at the exposed surface of the underlying conductor is etched away. The exposed surface of the underlying conductor is etched away to form a recessed area in the underlying conductor after etching away material from the layer of nitridation. A conductive via that forms a conductive contact with the underlying conductor is formed.

16 Claims, 3 Drawing Sheets

Related U.S. Application Data division of application No. 15/272,883, filed on Sep. 22, 2016, now Pat. No. 9,786,603.

(51) Int. Cl.
 *H01L 23/522* (2006.01)
 *H01L 23/528* (2006.01)
 *H01L 23/532* (2006.01)

(52) U.S. Cl.
 CPC .. *H01L 21/76814* (2013.01); *H01L 21/76826* (2013.01); *H01L 21/76831* (2013.01); *H01L 21/76849* (2013.01); *H01L 21/76879* (2013.01); *H01L 23/528* (2013.01); *H01L 23/5283* (2013.01); *H01L 23/5329* (2013.01); *H01L 23/53204* (2013.01); *H01L 23/53238* (2013.01); *H01L 23/53295* (2013.01)

(56) References Cited

U.S. PATENT DOCUMENTS

| | | |
|---|---|---|
| 6,528,180 B1 | 3/2003 | Lee et al. |
| 6,680,538 B2 | 1/2004 | Kim et al. |
| 6,696,360 B2 * | 2/2004 | Ahn .................... H01L 21/2855 438/632 |
| 6,736,701 B1 | 5/2004 | Shue et al. |
| 6,783,868 B2 | 8/2004 | Ciotti et al. |
| 6,910,947 B2 | 6/2005 | Paik |
| 6,913,938 B2 | 7/2005 | Shanmugasundram et al. |
| 6,919,636 B1 | 7/2005 | Ryan |
| 6,936,843 B2 | 8/2005 | Cui |
| 6,950,716 B2 | 9/2005 | Ward et al. |
| 6,952,052 B1 | 10/2005 | Marathe et al. |
| 6,961,626 B1 | 11/2005 | Paik |
| 6,984,198 B2 | 1/2006 | Krishnamurthy et al. |
| 6,999,836 B2 | 2/2006 | Schwarm et al. |
| 7,040,956 B2 | 5/2006 | Paik |
| 7,069,101 B1 | 6/2006 | Arackaparambil et al. |
| 7,082,345 B2 | 7/2006 | Shanmugasundram et al. |
| 7,272,459 B2 | 9/2007 | Kokotov et al. |
| 7,282,802 B2 * | 10/2007 | Clevenger ......... H01L 21/76802 257/751 |
| 7,333,871 B2 | 2/2008 | Schwarm |
| 7,337,019 B2 | 2/2008 | Reiss et al. |
| 7,349,753 B2 | 3/2008 | Paik |
| 7,354,332 B2 | 4/2008 | Surana |
| 7,429,539 B2 | 9/2008 | Matsuyama et al. |
| 7,514,361 B2 | 4/2009 | Bonilla et al. |
| 7,727,888 B2 | 6/2010 | Yang et al. |
| 8,138,604 B2 | 3/2012 | Yang et al. |
| 8,232,196 B2 | 7/2012 | Yang et al. |
| 8,361,900 B2 | 1/2013 | Pan et al. |
| 8,431,482 B1 * | 4/2013 | Ryan .................... H01L 23/535 257/750 |
| 8,664,766 B2 | 3/2014 | Yang et al. |
| 2004/0115407 A1 | 6/2004 | Cohen et al. |
| 2005/0003660 A1 | 1/2005 | Murakawa et al. |
| 2006/0175708 A1 | 8/2006 | Ueno |
| 2007/0287294 A1 | 12/2007 | Ko et al. |
| 2010/0022086 A1 * | 1/2010 | Choi ................. H01L 21/76814 438/653 |
| 2013/0012032 A1 | 1/2013 | Liu et al. |
| 2013/0043591 A1 * | 2/2013 | Yang ................. H01L 21/76838 257/751 |
| 2017/0018500 A1 * | 1/2017 | Lee ................... H01L 23/53238 |

OTHER PUBLICATIONS

J.A. Wilks et al., Nitridation of organo-silicate glass: A self-limiting process for PVD Ta1+xN/Ta barrier formation, Applied Surface Science 255, Aug. 2009, 9543-9547.

C.C. Yang et al., Enhanced Via Integration Process for Copper/Ultralow-k Interconnects, IEEE Electron Device Letters, vol. 31, No. 4, Apr. 2010.

List of IBM Patents or Patent Applications Treated as Related dated Oct. 30, 2017, 2 pages.

* cited by examiner

SURFACE NITRIDATION IN METAL INTERCONNECTS

BACKGROUND

Technical Field

The present invention generally relates to the formation of metal interconnects and, more particularly, to the nitridation of vias before such vias are filled with conductive material.

Description of the Related Art

Vias and other interconnects are formed in and through integrated chips to provide power and communication between components on the chips. Frequently these interconnects are made with copper wires that are formed in the bulk of an insulating material such as, e.g., silicon dioxide. However, when the interconnect metal is formed in direct contact with the insulating material, the interconnect material may diffuse into the dielectric material, degrading the performance (in particular, the conductivity) of the interconnect.

To address this problem, conventional fabrication processes deposit a liner of, e.g., tantalum nitride, between the interconnect and the bulk of the dielectric. The liner prevents the dispersion of interconnect material into the dialectric. However, different liner materials affect the resistance of the interconnect in different ways.

SUMMARY

A method of forming vias includes nitridizing exposed surfaces of a first layer and an exposed surface of a conductor underlying the first layer to form a layer of nitridation at said exposed surfaces. Material from the layer of nitridation at the exposed surface of the underlying conductor is etched away. The exposed surface of the underlying conductor is etched away to form a recessed area in the underlying conductor after etching away material from the layer of nitridation. A conductive via that forms a conductive contact with the underlying conductor is formed.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention employ nitridation of a via before deposition of conductive material to improve the conductive qualities of the via. A liner metal is then deposited over the nitridized surface before deposition of the interconnect metal. However, the nitridation of the surface of the underlying interconnect increases the resistance between that interconnect and the via, so the present embodiments remove the nitridized surface, creating a gouge in the underlying interconnect.

Figure 1:
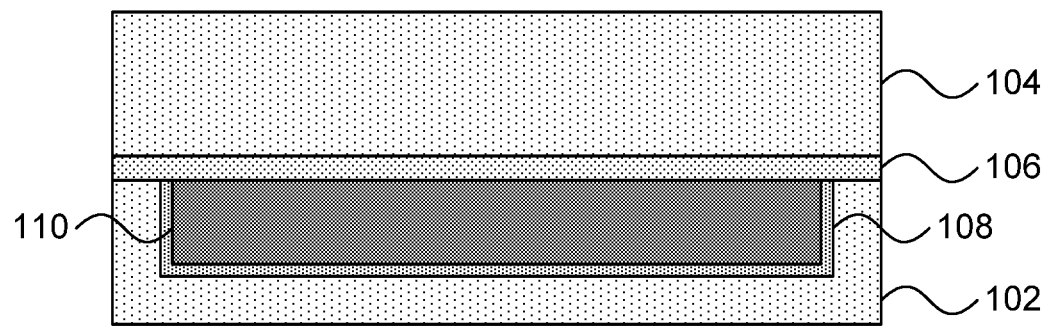
FIG. 1 is a cross-sectional diagram of a step in the formation of a conductive via in accordance with one or more of the present embodiments.

Referring now to the drawings in which like numerals represent the same or similar elements and initially to FIG. 1, a step in the formation of a via is shown. A first dielectric layer 102 and a second dielectric layer 104 are formed and bonded to one another. An interfacial dielectric layer 106 is formed between the first dielectric layer 102 and the second dielectric layer 104. The first dielectric layer 102 and the second dielectric layer 104 may be formed from any inter-level or intralevel dielectric material including organic and/or inorganic dielectrics. The first and second dielectric layers 102/104 may be porous or non-porous. The dielectric material used for the first and second dielectric layers 102/104 may include, e.g., silicon dioxide, silsesquioxanes, carbon-doped oxides, thermosetting polyarylene ethers, or multi-layers thereof. The first and second dielectric layers 102/104 may have a dielectric constant of about 4.0 or less, with one specific embodiment including materials that have a dielectric constant of about 2.8.

The first dielectric layer 102 is provided with an interconnect 110. It is specifically contemplated that the interconnect 110 may be formed from copper, but it should be understood that any appropriate conductor may be used instead. The interconnect 110 has a liner 108 that helps the interconnect 110 adhere to the first dielectric layer 102 and prevents diffusion of the interconnect material into the first dielectric layer 102. The liner 108 may be formed from any appropriate material such as, e.g., tantalum nitride.

Alternative materials for the interconnect 110 include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

Figure 2:
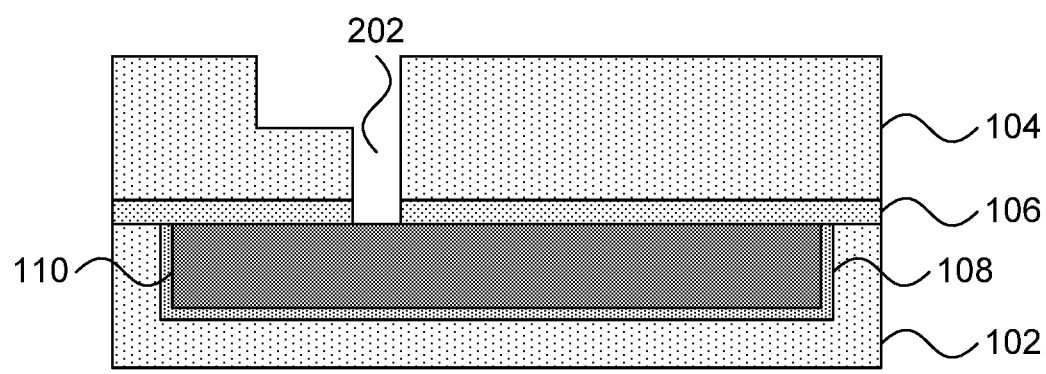
FIG. 2 is a cross-sectional diagram of a step in the formation of a conductive via in accordance with one or more of the present embodiments.

Referring now to FIG. 2, a step in the formation of a via is shown. Trenches 202 are formed in the second dielectric layer 104. The trenches 202 may be formed by any appropriate process including, e.g., lithographic techniques that utilize a mask and an anisotropic etch to remove material in particular locations and to a particular depth. It is specifically contemplated that at least one trench 202 will fully penetrate the second dielectric layer 104, reaching to the conductive material of interconnect 110 below.

In one particular embodiment, the trenches 202 may be formed by photolithography. A patterned photoresist can be produced by applying a blanket photoresist layer to the surface of the second dielectric layer 104, exposing the photoresist layer to a pattern of radiation, and then developing the pattern into the photoresist layer utilizing resist developer, which leaves open the regions of the trenches 202. Etching of the exposed portion of the second dielectric layer 104 may include an etch chemistry for removing the exposed portion of the dielectric material and having a high selectivity to the material of the interconnect 110. In one embodiment, the etch process may be an anisotropic etch process, such as reactive ion etch (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used to etch the trenches 202 include ion beam etching, plasma etching or laser ablation.

Figure 3:
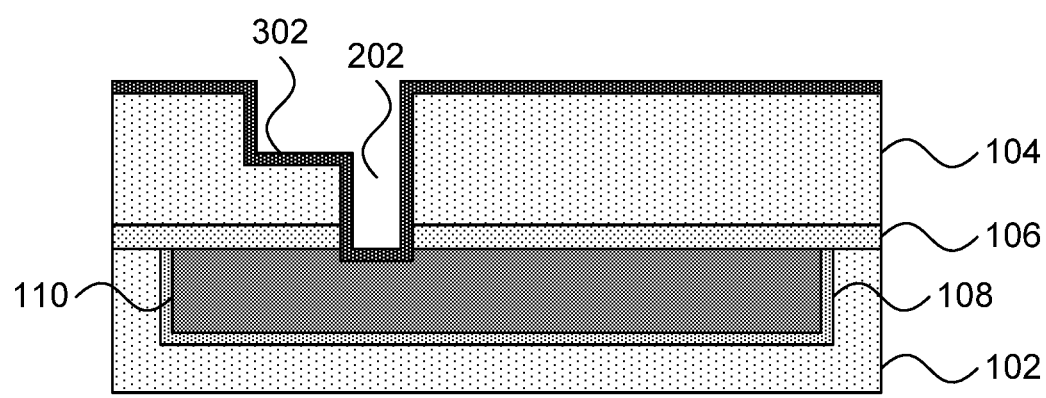
FIG. 3 is a cross-sectional diagram of a step in the formation of a conductive via in accordance with one or more of the present embodiments.

Referring now to FIG. 3, a step in the formation of a via is shown. The exposed surfaces of the second dielectric layer 104 and the interconnect 110 are exposed to a surface nitridizing process that forms a layer of nitridation 302 at those surfaces. The layer of nitridation 302 denotes portion of a surface that has a higher nitrogen content than an un-enriched material after a nitridation process, as described below. While the thermal nitridation process described below is specifically contemplated, it should be understood that any appropriate nitridation process may be used instead.

Thermal nitridation may include exposing the exposed surfaces of the trench 202 and the interconnect 110 to a nitrogen-containing gas. Examples of nitrogen-containing gases include, but are not limited to nitrogen gas, ammonia, ammonium, nitric oxide, and mixtures thereof. The nitrogen-containing gas can be pure or can be diluted with hydrogen gas or an inert gas such as helium, neon, argon, and mixtures thereof. The nitrogen concentration in the nitridizing gas may be from about 10% to about 100%, with a range of about 50% to about 80% being preferred. In one embodiment, thermal nitridation is performed at a temperature between about 50° C. and about 450° C., with a range between about 100° C. and about 300° C. being preferred. The layer of nitridation 302 varies depending on the type of nitrogen-containing gas and the temperature at which the thermal nitridation is performed. The depth of the layer of nitridation 302 may be between 0.5 mm and about 20 nm.

The nitrogen chemically reacts with the surface of the second dielectric layer 104 and the interfacial dielectric layer 106, such that the layer of nitridation 302 forms high-resistance barrier that enhances the performance of the via. The portion of the layer of nitridation 302 that forms on the interconnect 110, however, is formed in a location that would impede conductivity between the interconnect 110 and the via.

Figure 4:
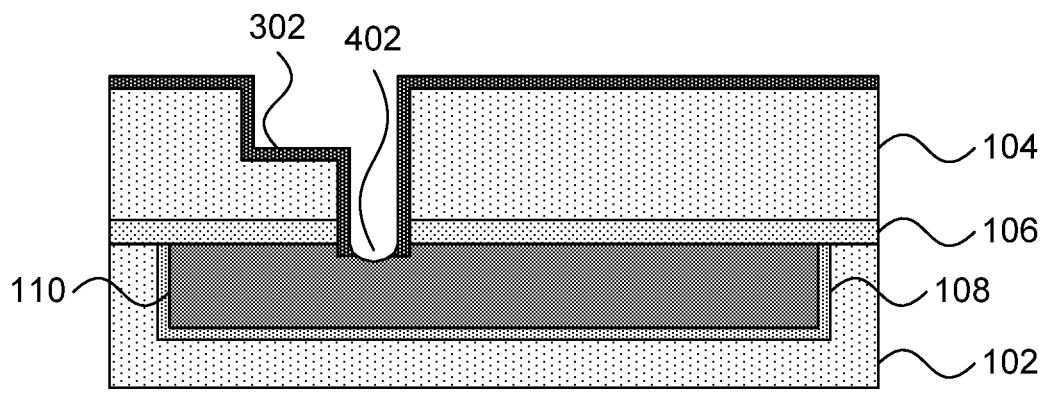
FIG. 4 is a cross-sectional diagram of a step in the formation of a conductive via in accordance with one or more of the present embodiments.

Referring now to FIG. 4, a step in the formation of a via is shown. An etch is performed to remove the nitridized surface from the interconnect 110, forming a gouge 402 in that surface where the surface of the interconnect 110 is recessed. It is specifically contemplated that the etch may include a plasma etch with mixed argon and helium plasma, but any appropriately selective etch may be used instead to remove material from the interconnect without harming the remainder of the layer of nitridation 302 on the second dielectric layer 104 and the interfacial dielectric layer 106. The gouge 402 may have an exemplary depth of about 5 Å to about 200 Å, with the depth being sufficient to remove the nitridized material at the surface of the interconnect 110.

Figure 5:
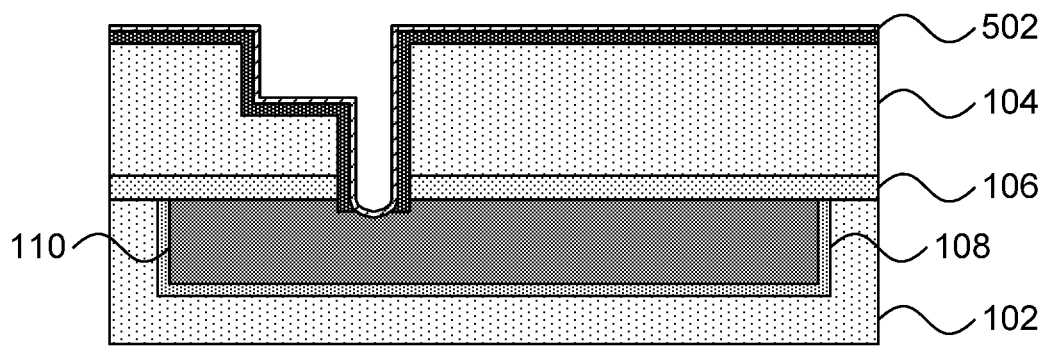
FIG. 5 is a cross-sectional diagram of a step in the formation of a conductive via in accordance with one or more of the present embodiments.

Referring now to FIG. 5, a step in the formation of a via is shown. A layer material is deposited over the layer of nitridation 302 and the gouge 402 in the interconnect 110. It is specifically contemplated that the layer material may be formed using PVD and may include metals such as tantalum, ruthenium, cobalt, titanium, or tungsten. The deposition of a metal on the layer of nitridation 302 forms a layer of interfacial material 502 which prevents diffusion of the via material. The layer of interfacial material 502 an exemplary thickness of between about 2 nm and about 50 nm.

It should be understood that the etch of the gouge 402 and the deposition of the layer of interfacial material 502 may be performed in separate processes or in a single process. For embodiments that perform both steps in a single process, the etch of FIG. 4 may be performed in a mixed argon/helium plasma with the addition of metal ions, such that the interfacial layer 502 is deposited even as the thin layer of nitridation on the interconnect 110 is removed.

Figure 6:
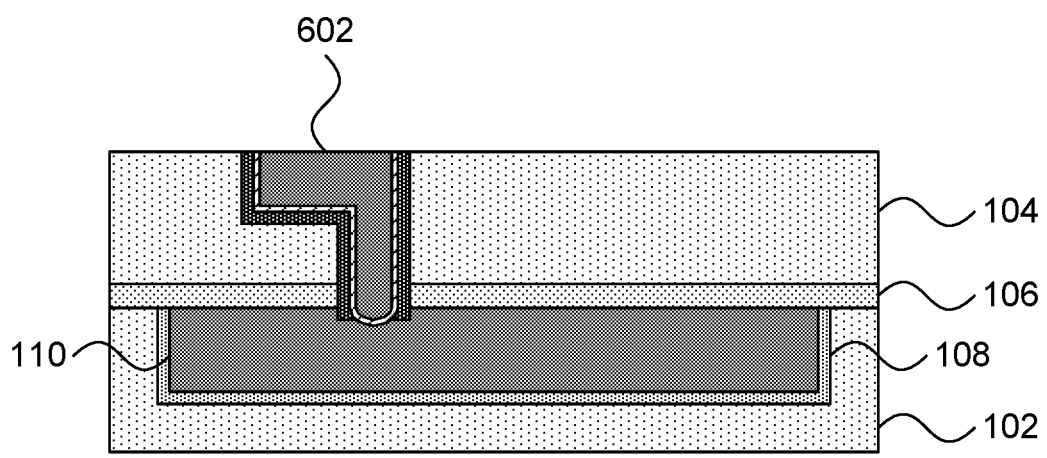
FIG. 6 is a cross-sectional diagram of a step in the formation of a conductive via in accordance with one or more of the present embodiments.

Referring now to FIG. 6, a step in the formation of a via is shown. A conductive via 602 is formed in the trench 202. The conductive via 602 may be formed by depositing a layer of conductive material in the trench 202 and over the second dielectric layer 104 and then polishing the material down using, for example, a chemical mechanical planarization (CMP) process. It is specifically contemplated that the conductive via is formed from copper and that the material is deposited using, e.g., a chemical vapor deposition (CVD) process, but any appropriate deposition process may be used instead, such as atomic layer deposition, PVD, or gas cluster ion beam (GCIB) deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

CMP is performed using, e.g., a chemical or granular slurry and mechanical force to gradually remove upper layers of the device. The slurry may be formulated to be unable to dissolve, for example, the second dielectric layer 104, resulting in the CMP process's inability to proceed any farther than that layer.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a" "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 7:
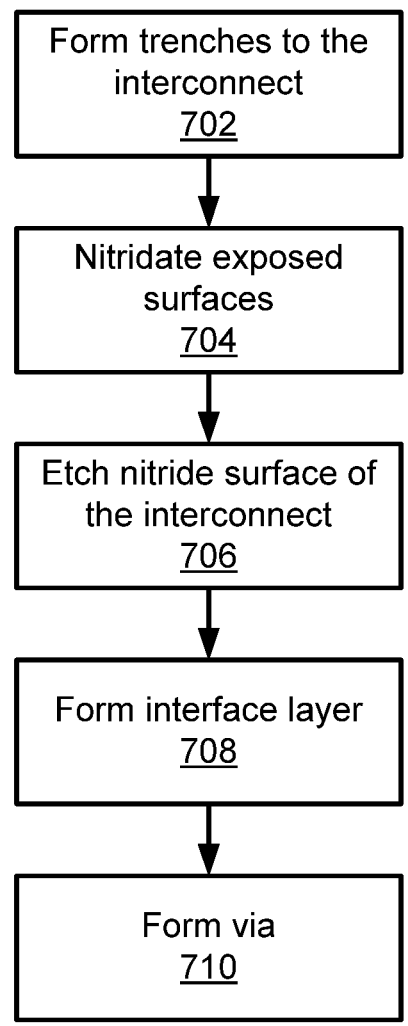
FIG. 7 is a block/flow diagram of a method of forming a conductive via in accordance with one or more of the present embodiments.

Referring now to FIG. 7, a method of forming a via is shown. Block 702 forms trenches 202 that penetrate one or more dielectric layers to reach an underlying interconnect 110. As noted above, these trenches may be formed using any appropriate etching process, such as photolithographic processes using RIE. Block 704 forms a nitridized layer 302 over the exposed surfaces of the dielectric layer(s) and the interconnect 110. The surface nitridation may be performed in, e.g., a PVD chamber using ammonia or nitrogen gas.

Block 706 etches the nitridized surface of the interconnect 110, forming a gouge 402. The gouge 402 represents material that was removed from the surface of the interconnect 110, taking along with it the nitridized surface material. Block 708 forms a conductive interface layer over the nitridized surfaces of the dielectric layer(s) and the gouge 402 from, e.g., tantalum, ruthenium, cobalt, titanium, or tungsten.

Block 710 then forms the via 602 by depositing conductive material in the trench 202 and the gouge 402. The conductive material may be deposited using any appropriate process, such as CVD, PVD, ALD, or GCIB deposition, and then polished down to the level of the dielectric layer(s) using, e.g., CMP.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a via, comprising:
   nitridizing exposed surfaces of a first layer and an exposed surface of a conductor underlying the first layer to form a layer of nitridation at said exposed surfaces;
   etching away material from the layer of nitridation at the exposed surface of the underlying conductor and etching away the exposed surface of the underlying conductor in a single etch process to form a recessed area in the underlying conductor; and
   forming a conductive via that forms a conductive contact with the underlying conductor.

2. The method of claim 1, further comprising forming a conductive interface layer on the layer of nitridation on the exposed surface of the first layer and in the recessed area.

3. The method of claim 2, wherein forming the conductive interface layer is performed at the same time as the exposed surface of the underlying conductor is etched away.

4. The method of claim 2, wherein forming the conductive interface layer and etching away the exposed surface of the underlying conductor are performed sequentially.

5. The method of claim 1, wherein etching away the exposed surface of the underlying conductor comprises etching with a helium/argon plasma.

6. The method of claim 5, wherein the helium/argon plasma further comprises metal ions for simultaneous deposition of a conductive interface layer.

7. The method of claim 1, wherein the nitridizing comprises thermally nitridizing the exposed surfaces in a nitrogen-containing gas at a temperature between about 100° C. and about 300° C.

8. The method of claim 1, wherein the recessed area has a depth between about 5 Å and about 200 Å.

9. A method of forming a via, comprising:
   nitridizing exposed surfaces of a first layer and an exposed surface of a conductor underlying the first layer to form a layer of nitridation at said exposed surfaces;
   etching away material from the layer of nitridation at the exposed surface of the underlying conductor and etching away the exposed surface of the underlying conductor in a single etch process to form a recessed area in the underlying conductor; and
   forming a conductive via that forms a conductive contact with the underlying conductor in a same process as the single etch process.

10. The method of claim 9, further comprising forming a conductive interface layer on the layer of nitridation on the exposed surface of the first layer and in the recessed area.

11. The method of claim 10, wherein forming the conductive interface layer is performed at the same time as the exposed surface of the underlying conductor is etched away.

12. The method of claim 10, wherein forming the conductive interface layer and etching away the exposed surface of the underlying conductor are performed sequentially.

13. The method of claim 9, wherein etching away the exposed surface of the underlying conductor comprises etching with a helium/argon plasma.

14. The method of claim 13, wherein the helium/argon plasma further comprises metal ions for simultaneous deposition of a conductive interface layer.

15. The method of claim 9, wherein the nitridizing comprises thermally nitridizing the exposed surfaces in a nitrogen-containing gas at a temperature between about 100° C. and about 300° C.

16. The method of claim 9, wherein the recessed area has a depth between about 5 Å and about 200 Å.

* * * * *